(12) United States Patent
Wang et al.

(10) Patent No.: US 9,053,713 B2
(45) Date of Patent: Jun. 9, 2015

(54) HIGH COERCIVITY MAGNETIC FILM FOR USE AS A HOT SEED IN A MAGNETIC WRITE HEAD AND METHOD TO GROW IT

(71) Applicant: Headway Technologies, Inc., Milpitas, CA (US)

(72) Inventors: Shengyuan Wang, San Jose, CA (US); Kunliang Zhang, Fremont, CA (US); Min Li, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 120 days.

(21) Appl. No.: 13/651,437

(22) Filed: Oct. 14, 2012

(65) Prior Publication Data

US 2014/0106182 A1 Apr. 17, 2014

(51) Int. Cl.
| | |
|---|---|
| *G11B 5/127* | (2006.01) |
| *G11B 5/31* | (2006.01) |
| *C23C 14/02* | (2006.01) |
| *C23C 14/16* | (2006.01) |

(52) U.S. Cl.
CPC ......... *G11B 5/1278* (2013.01); *Y10T 428/1171* (2015.01); *G11B 5/3116* (2013.01); *G11B 5/3163* (2013.01); *C23C 14/024* (2013.01); *C23C 14/16* (2013.01)

(58) Field of Classification Search
None
See application file for complete search history.

(56) References Cited

U.S. PATENT DOCUMENTS

| | | | |
|---|---|---|---|
| 6,771,464 B2 | 8/2004 | Minor | |
| 6,912,106 B1 * | 6/2005 | Chen et al. | 360/125.42 |
| 7,522,377 B1 * | 4/2009 | Jiang et al. | 360/125.12 |
| 7,688,545 B1 * | 3/2010 | Vas'Ko et al. | 360/125.45 |
| 7,842,409 B2 | 11/2010 | Girt | |
| 8,023,231 B2 | 9/2011 | Guan et al. | |
| 2006/0119982 A1 * | 6/2006 | Honjo et al. | 360/126 |
| 2006/0215315 A1 * | 9/2006 | Miyake et al. | 360/126 |
| 2007/0047140 A1 * | 3/2007 | Tabakovic et al. | 360/126 |
| 2007/0188916 A1 * | 8/2007 | Miyake | 360/126 |
| 2011/0032645 A1 | 2/2011 | Noel et al. | |

OTHER PUBLICATIONS

"Optimization of high Bsat FeCo films for write pole applications," by Ming Mao, et al., Journal of Applied Physics, 97, 10F908 (2005), May 10, 2005, pp. 1-3.

"Soft anisotropic high magnetization Cu/FeCo films," by H.S. Jung et al., Applied Physics Letters, vol. 81, No. 13, Sep. 23, 2002, pp. 2415-2417.

"Soft Magnetic Properties and Microstructure of NiFe(Cr)/FeCo/NiFe(Cr) Films With Large Saturation Magnetization," IEEE Transactions on Magnetics, vol. 38, No. 5, Sep. 2002, pp. 2225-2227.

"Structure, Stress, and Magnetic Properties of High Saturation Magnetization Films of FeCo," by Vladyslav A. Vas'Ko, et al., IEEE Transactions on Magnetics, vol. 40, No. 4, Jul. 2004, pp. 2335-2337.

* cited by examiner

*Primary Examiner* — Kevin Bernatz
(74) *Attorney, Agent, or Firm* — Saile Ackerman LLC; Stephen B. Ackerman

(57) ABSTRACT

A sub-structure, suitable for use as a hot seed on which to form a perpendicular magnetic main write pole, is described. It is made up of a buffer layer of atomic layer deposited alumina on which there are one or more seed layers having a body-centered cubic (bcc) crystal structure. Finally, the high coercivity magnetic film lies on the seed layer(s). It is critical that the high coercivity magnetic film be deposited at a very low deposition rate (around 1 Angstrom per second).

9 Claims, 3 Drawing Sheets

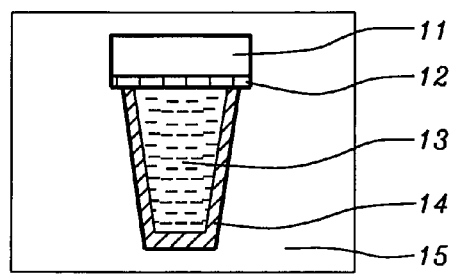
FIG. 1 – Prior Art
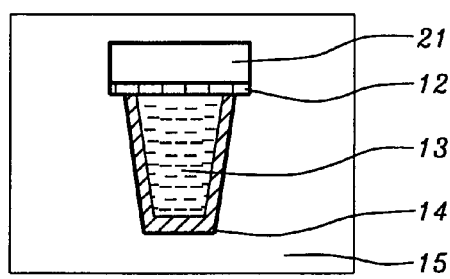
FIG. 2
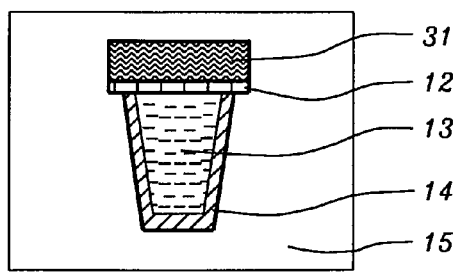
FIG. 3
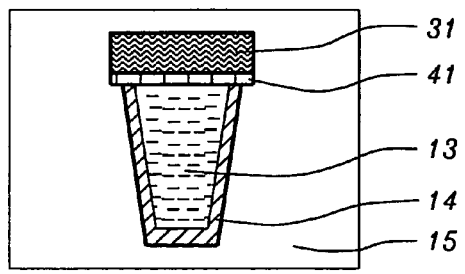
FIG. 4a
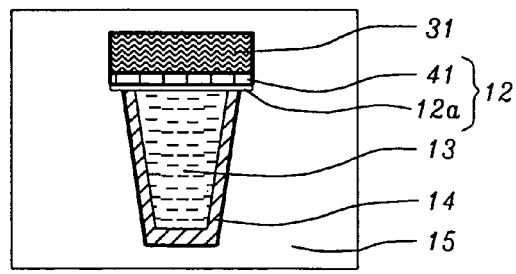
FIG. 4b

HIGH COERCIVITY MAGNETIC FILM FOR USE AS A HOT SEED IN A MAGNETIC WRITE HEAD AND METHOD TO GROW IT

TECHNICAL FIELD

The disclosed material relates to the general field of perpendicular magnetic write poles with particular reference to the design and formation of hot seed layers on which such poles are grown (main pole is under hot seed layers).

BACKGROUND

To further increase the storage areal density of the hard disk drive (HDD) system, there has been a growing demand for improving the performance of magnetic recording heads. In a current perpendicular magnetic recording (PMR) head, a single pole writer with a tunneling magnetoresistive (TMR) reader provides a high writing field and a large read-back signal to achieve a higher areal density.

The single pole writer consists of a main pole (MP) surrounded by magnetic shield materials from which the MP is separated by a nonmagnetic spacer layer. The MP has a tapered shape whose tip faces the magnetic media as well as serving as an air bearing surface (ABS). In addition to the MP and the magnetic shield materials, a single pole writer also includes a pair of pancake-like conductive coils. These two coils are connected through a center tab, with one placed above the MP and the other under the MP perpendicular to the ABS direction. During writing, an electric current is applied through the coils, causing a large magnetic field to be generated from the MP tip. This field is used to change the polarity of the magnetic media.

An MP ABS view of a prior art design is shown in FIG. 1. In ABS view the MP body 13 has a triangular or trapezoidal shape. As seen, the MP width (PW) defines the track width in the media. Soft magnetic shield materials 15 are used around the MP with a nonmagnetic spacer in between. The nonmagnetic space 14 on the two sides of the MP is called the Side Gap (SG) and the nonmagnetic space 12 above the MP is called the Write Gap (WG). Above the WG, a high magnetic magnetization material 11, such as Fe(1-x)Co(x) (x=20-55 at %), Fe(1-y)Ni(y) (y=5-55 at %) etc, is deposited above the MP write gap 12. This high magnetic magnetization layer 11 is the so-called "hot seed".

SUMMARY

It has been an object of at least one embodiment of the present disclosure to provide a hot seed layer that is well suited to serve as a substrate on which to build a perpendicular magnetic write pole wherein the hot seed layer is above the main pole.

Another object of at least one embodiment of the present disclosure has been that said hot seed have high coercivity and low anisotropy.

Still another object of at least one embodiment of the present disclosure has been that said high coercivity be stable to temperatures of up to 120° C.

A further object of at least one embodiment of the present disclosure has been to provide a process for manufacturing said hot seed layer.

These objects have been achieved by first depositing one or more seed layers having a body-centered cubic (bcc) crystal structure on the write gap. This is followed by the deposition of a buffer layer of alumina on the seed layer(s). It is important for this buffer layer to be laid down through atomic layer deposition (ALD) so as to achieve maximum conformal coverage.

Finally, a high coercivity magnetic film is deposited onto the layer of ALD alumina. It is a key feature of the disclosed method and structure that this high coercivity magnetic film be deposited at a very low deposition rate (around 1 Angstrom per second).

BRIEF DESCRIPTION OF THE DRAWINGS

FIG. 1 is an ABS view of a MP of the prior art.

FIG. 2 is an ABS view of an MP with FeCo hot seed using high deposition power.

FIG. 3 is an ABS view of an MP with FeCo hot seed using low deposition power.

FIG. 4a is an ABS view of an MP with an ALD $Al_2O_3$ buffer layer and an overlying FeCo hot seed layer using low deposition power, and FIG. 4b is an embodiment of the present disclosure wherein the write gap is a composite with two layers.

DETAILED DESCRIPTION

Figure 5:
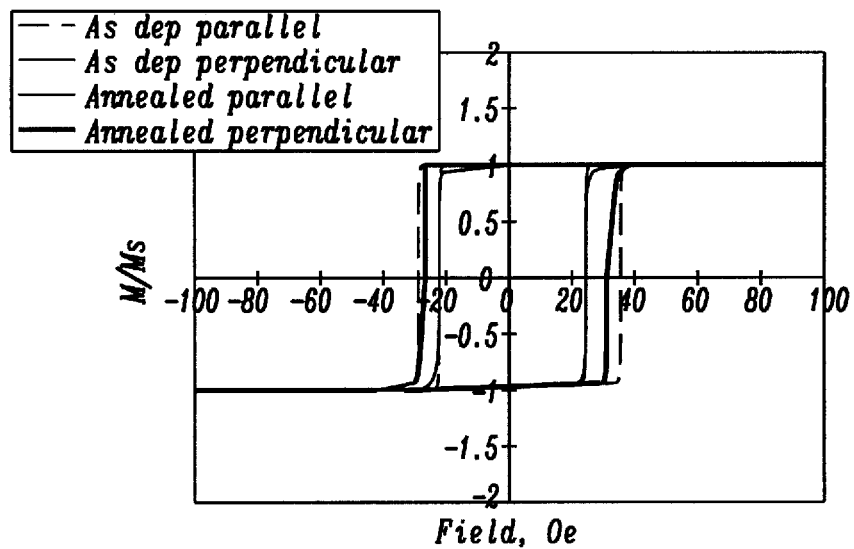
FIG. 5 Hysteresis loops of as-deposited and post-annealed FeCo films using 2 KW deposition power.

The disclosed material includes a method to grow a high coercivity $Fe_{1-x}Co_x$ (x range 20-55) film or a high coercivity $Fe_{1-x}Ni_x$ (x range 5-55) film as the hot seed for a magnetic recording writer. This method involves using a low deposition power scheme in a Physical Vapor Deposition (PVD) system. When this deposition scheme is used, the coercivity of the $Fe_{1-x}Co_x$ (x ranging from 20 to 55) hot seed—hereinafter to be referred to as the "special hot seed"—is greatly improved for both its as-deposited state as well as for its post magnetic anneal state.

A buffer layer may be inserted beneath the special hot seed. This buffer layer is an $Al_2O_3$ film, which should be formed by Atomic Layer Deposition (ALD). Additionally, one or more seed layers that have bcc crystalline structures may be inserted between the special hot seed and the ALD $Al_2O_3$ buffer layer.

The special hot seed was processed in a Nexus PVDi system manufactured by Veeco. The film is deposited at an Ar flow rate of 50 sccm, the process pressure was 3 mtorr, and the target-substrate distance of about 65 mm. The typical special hot seed thickness ranged from about 200 Å to 1,000 Å.

The special hot seed film was deposited directly onto the WG. The WG materials are nonmagnetic and act as an isolating spacer between the MP and the hot seed. The typical thickness for the WG is 50-350 Å. Typical WG materials are $Al_2O_3$, $SiO_2$, Ru, etc. The magnetic properties were determined by measuring hysteresis loops using a BH looper (SHB instrument, Inc.) for the as-deposited films and annealed films.

The annealing conditions were 220° C. for 2 hours in a 250 Oe applied magnetic field. The deposition power, which in turn determined the deposition rate, was adjustable. FIG. 2 illustrates an MP ABS view for the case in which the special hot seed 21 was deposited at a relatively high deposition rate such as >3.6 Å per second.

In the first embodiment, as shown in FIG. 3, special hot seed 31, about 500 Å thick, was deposited at a relatively low deposition rate such as =3.6 Å per second Typically, the coercivity of the special hot seed formed a the lower deposition rate was found to be greater than that formed at the higher deposition rate i.e. the lower the deposition rate, the higher the coercivity of the deposited film.

In the second embodiment, as shown in FIG. 4a, buffer layer 41 was added below special hot seed layer 31. This buffer layer was 50-350 Angstroms of $Al_2O_3$ formed in an Atomic Layer Deposition (ALD) system. The ALD-formed buffer layer can serve as all or part of the WG 12 thickness as depicted in FIG. 4b where the alumina buffer layer 41 is formed on a lower write gap layer 12a. The ALD-formed $Al_2O_3$ buffer layer is amorphous, thus it has less crystalline effect on the hot seed layer above.

The hysteresis loops of special hot seeds grown at 4.8 Å per second deposition rate (2 KW deposition power) are shown in FIG. 5. An approximately 300 Å $Al_2O_3$ layer, formed through ALD, was used as the buffer layer. It was found that the as-deposited films are magnetically isotropic with coercivity about 20-30 Oe. The overall coercivity did not vary significantly post magnetic anneal but did become slightly lower in the annealing field direction.

Figure 6:
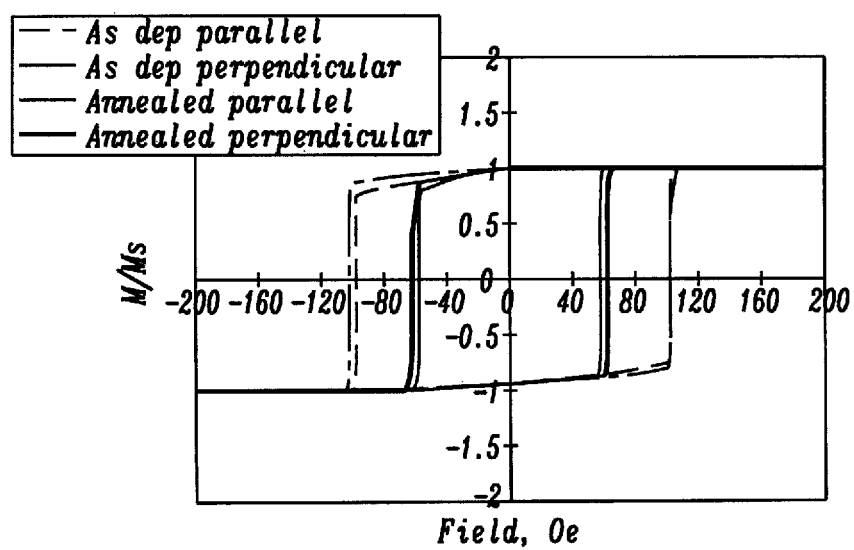
FIG. 6 Hysteresis loops of as-deposited and post-annealed FeCo films using 0.5 KW deposition power.

The hysteresis loops for a special hot seed film formed with 0.5 KW deposition power (1.2 Å/sec.) are shown in FIG. 6. A ~300 Å $Al_2O_3$ buffer layer formed through ALD was used as the buffer layer. These films were also magnetically isotropic but their coercivity was greatly enhanced to about 100 Oe for as-deposited films. This coercivity dropped to about 60 Oe post magnetic annealing but was still 2.5 times larger than that of an annealed film formed at 2 KW deposition power (4.8 Å/sec.).

Figure 7:
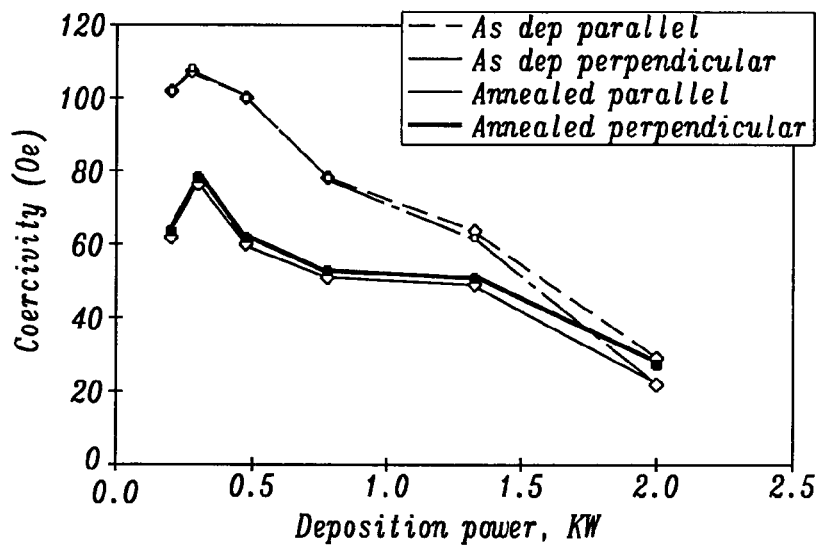
FIG. 7 Coercivity vs. deposition power for as-deposited and post-anneal FeCo films.

FIG. 7 summarizes the coercivity vs. the deposition power relationship for special hot seed films. The deposition power ranged from 0.2 KW to 2 KW, corresponding to a deposition rate range of from ~0.48 to ~4.8 Å/sec. All films had thicknesses of about 1,000 Å and were deposited on an ALD $Al_2O_3$ buffer layer about 300 Å thick. BH loop measurements showed the films to be isotropic. The coercivity increased nearly monotonically with decreasing deposition rate. The maximum coercivity (about 115 Oe for an as-deposited film and about 77 Oe for a post anneal film) was found to occur at a deposition power of 0.3 KW (0.72 Å/sec.).

Figure 8:
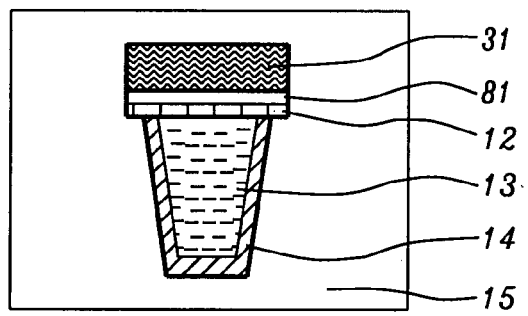
FIG. 8 ABS view of an MP with bcc seed layers located between the hot seed and the ALD $Al_2O_3$ buffer layer.

FIG. 8 illustrates an embodiment wherein one or more seed layers 81 of Body-Centered Cubic (bcc) material were inserted between the special hot seed 31 and WG 12 (including the ALD $Al_2O_3$ buffer layer). The bcc seed layers serve to improve the bcc crystalline growth of the special hot seed layer, resulting in a higher coercivity because of the higher intrinsic crystalline anisotropy.

Additionally, since these bcc seed layer(s) are nonmagnetic they can be counted as part of the WG thickness surrounding the magnetic recording writer's main pole. Materials for the bcc seed layer(s) can be Ta, W, TaW, Ti, V, Cr, Mn, $Ni_{1-x}Cr_x$ (x range 28-100), $Cr_{1-x}Ti_x$ (x range 0-37), including any combinations that crystallize as superlattices.

Figure 9:
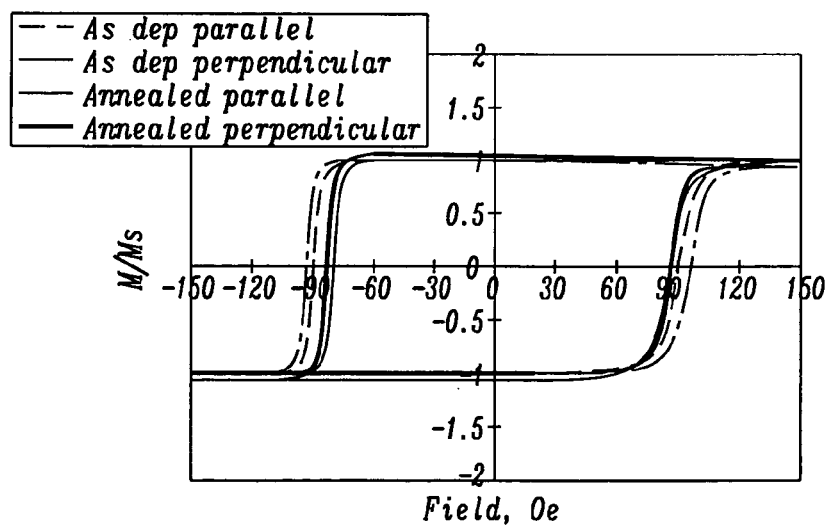
FIG. 9 Hysteresis loops of 1,000 Å FeCo film grown on Ta 50 Å seed layer in as-deposited and post-annealed states.

FIG. 9 shows an example of this bcc seed layer effect. A 50 Å Ta layer was inserted between a special hot seed deposited at low-power and the ALD $Al_2O_3$ buffer layer. The as-deposited film was magnetically isotropic with a coercivity of about 95 Oe. The post annealed film shows a coercivity of about 85 Oe. This reduced drop in coercivity confirmed the advantages of the bcc seed layer insertion.

What is claimed is:

1. A perpendicular magnetic recording (PMR) writer, comprising:
(a) a write gap (WG) formed on a main pole layer, the WG comprises;
   (1) a first write gap layer; and
   (2) a buffer layer of atomic layer deposited (ALD) alumina on the first write gap layer;
(b) one or more non-magnetic seed layers that are metals or alloys having a body centered cubic (bcc) crystal structure formed on the buffer layer; and
(c) an isotropic magnetic film with substantial coercivity that serves as a hot seed and is selected from the group consisting of $Fe_{1-x}Co_x$ (x range 20-55) and $Fe_{1-x}Ni_x$ (x range 5-55) formed on the one more non-magnetic seed layers to give a stack with a first WG layer/buffer layer/non-magnetic seed layer(s)/hot seed configuration.

2. The PMR writer described in claim 1 wherein one or more of said non-magnetic seed layers is selected from the group consisting of Ta, W, TaW, Ti, V, Cr, Mn, $Ni_{1-x}Cr_x$ (x range 28-100), and $Cr_{1-x}Ti_x$ (x range 0-37).

3. The PMR writer described in claim 1 wherein said magnetic film has a coercivity greater than 70 Oe, as deposited, and a coercivity greater than 60 Oe, after being magnetically annealed.

4. The PMR writer described in claim 1 wherein said buffer layer is also part of said WG.

5. The PMR writer described in claim 1 wherein said bcc non-magnetic seed layer(s) constitute part of said WG.

6. The PMR writer described in claim 1 wherein said WG has a thickness in a range of 50-350 Å.

7. The PMR writer described in claim 1 wherein said magnetic film has a thickness in a range of 200-1,000 Å.

8. The PMR writer described in claim 1 wherein said buffer layer of ALD alumina has a thickness in a range of 50-350 Å.

9. The PMR writer described in claim 1 wherein said one or more bcc non-magnetic seed layers is Ta having a thickness of about 50 Å.

* * * * *